United States Patent
Fan et al.

(10) Patent No.: US 8,222,941 B2
(45) Date of Patent: Jul. 17, 2012

(54) PHASE SELECTOR

(75) Inventors: Wen-Teng Fan, Tainan County (TW);
Chan-Fei Lin, Tainan County (TW);
Shih-Chun Lin, Tainan County (TW)

(73) Assignee: Himax Technologies Limited, Tainan (TW)

( * ) Notice: Subject to any disclaimer, the term of this patent is extended or adjusted under 35 U.S.C. 154(b) by 192 days.

(21) Appl. No.: 12/759,886

(22) Filed: Apr. 14, 2010

(65) Prior Publication Data

US 2011/0255867 A1    Oct. 20, 2011

(51) Int. Cl.
*H03L 7/00* (2006.01)
(52) U.S. Cl. ......... 327/161; 327/147; 327/153; 327/158
(58) Field of Classification Search .................. 327/141, 327/144–163; 331/1 A, 15–17; 375/373–376; 370/532–541
See application file for complete search history.

(56) References Cited

U.S. PATENT DOCUMENTS

| | | | |
|---|---|---|---|
| 5,790,116 A * | 8/1998 | Malone et al. | 715/763 |
| 7,583,119 B2 * | 9/2009 | Song | 327/158 |
| 2006/0097767 A1 * | 5/2006 | Lu | 327/291 |
| 2006/0170459 A1 * | 8/2006 | Shin et al. | 326/113 |
| 2008/0030248 A1 * | 2/2008 | Song | 327/158 |
| 2008/0075222 A1 * | 3/2008 | Lee et al. | 375/376 |
| 2009/0015308 A1 * | 1/2009 | Fung et al. | 327/261 |
| 2009/0027098 A1 * | 1/2009 | Nguyen | 327/254 |
| 2010/0073060 A1 * | 3/2010 | Nguyen | 327/255 |
| 2010/0156476 A1 * | 6/2010 | Obkircher | 327/119 |

* cited by examiner

*Primary Examiner* — Lincoln Donovan
*Assistant Examiner* — Brandon S Cole
(74) *Attorney, Agent, or Firm* — J.C. Patents

(57) ABSTRACT

A phase selector including a plurality of buffers, a multiplexer, a first inverter, and a selecting circuit is provided. Each of the buffers provides a clock signal, and the clock signals have different phases. The multiplexer selectively outputs one of the clock signals as a switch signal according to a first control signal, wherein the first control signal is first portion of bits of a selecting signal. The input terminal of the first inverter receives a second control signal, wherein the second control signal is second portion of bits of the selecting signal, and the output terminal of the first inverter outputs an inverted signal. The selecting circuit transmits the second control signal of the selecting signal or the inverted signal to the output terminal of the phase selector according to the logic state of the switch signal.

7 Claims, 7 Drawing Sheets

PHASE SELECTOR

BACKGROUND OF THE INVENTION

1. Field of the Invention

The present invention relates to a phase selector.

2. Description of Related Art

In recent years, along with the development of technologies, the speed of optical communication system has been increased in order to achieve wider digital communication bandwidth. In the specification of optical communication, it is very important for a transmitter to synchronize the data and a clock signal received in parallel, wherein the phases of the data and the clock signal have to be calibrated first.

A delay locked loop (DLL) is usually used in a communication/information system as a clock control circuit, and which synchronizes the output signal with a reference clock signal in the circuit or allows the two to have a fixed phase delay. The DLL is always used as a clock synchronization circuit thanks to the low jitter thereof. FIG. 1 is a block diagram of a conventional phase selector 100. FIG. 2 illustrates the waveforms of a plurality of clock signals received by the phase selector 100 in FIG. 1. Referring to FIG. 1 and FIG. 2, the phase selector 100 includes N buffers B-1-B-N and an N-to-1 multiplexer 102, wherein N is a positive integer. A DLL 10 outputs N clock signals CLK-1-CLK-N according to a reference clock signal CLKref. The DLL 10 provides all the generated phases (i.e., the N clock signals CLK-1-CLK-N having different phases) to the phase selector 100. These phases (the clock signals CLK-1-CLK-N) are respectively transmitted to the multiplexer 102 through the buffers B-1-B-N. The multiplexer 102 selects one of the N phases (the clock signals) according to a selecting signal S. However, the greater the number N of candidate phases (the clock signals CLK-1-CLK-N) is, the more input buffers B-1-B-N have to be disposed in the phase selector 100, and accordingly the greater the size of the multiplexer 102 and the higher the power consumption of the phase selector 100 are.

SUMMARY OF THE INVENTION

Accordingly, the present invention is directed to a phase selector that resolves the problem of delay mismatch between inverted and non-inverted clock signals and offers reduced size and power consumption.

The present invention provides a phase selector including a plurality of first buffers, a multiplexer, a first inverter, and a selecting circuit. Each of the first buffers provides a clock signal, and the clock signals have difference phases. The multiplexer is coupled to the first buffers, and which selectively outputs one of the clock signals as a switch signal according to a first control signal, wherein the first control signal is first portion of bits of a selecting signal. The input terminal of the first inverter receives a second control signal, wherein the second control signal is second portion of bits of the selecting signal, and the output terminal thereof outputs an inverted signal. The selecting circuit is controlled by the switch signal. When the switch signal is in a first logic state, the selecting circuit transmits the second control signal of the selecting signal to the output terminal of the phase selector, and when the switch signal is in a second logic state, the selecting circuit transmits the inverted signal to the output terminal of the phase selector.

According to an embodiment of the present invention, the phase selector further includes a second buffer coupled to the selecting circuit for buffering the second control signal of the selecting signal.

According to an embodiment of the present invention, the second buffer includes a second inverter and a third inverter. The input terminal of the second inverter receives the second control signal of the selecting signal. The input terminal of the third inverter is connected to the output terminal of the second inverter, and the output terminal of the third inverter is connected to the selecting circuit.

According to an embodiment of the present invention, the selecting circuit includes a first switch and a second switch. The first end of the first switch receives the second control signal of the selecting signal, and the second end of the first switch is coupled to the output terminal of the phase selector. The first switch is turned on when the switch signal is in the first logic state. The first end of the second switch receives the inverted signal, and the second end of the second switch is coupled to the output terminal of the phase selector. The second switch is turned on when the switch signal is in the second logic state.

According to an embodiment of the present invention, the phase selector further includes a fourth inverter, wherein the input terminal of the fourth inverter is coupled to the multiplexer for inverting the switch signal.

According to an embodiment of the present invention, the first switch includes a first P-type transistor and a first N-type transistor. The gate of the first P-type transistor is coupled to the multiplexer for receiving the switch signal, the first source/drain of the first P-type transistor receives the second control signal of the selecting signal, and the second source/drain of the first P-type transistor is coupled to the output terminal of the phase selector. The gate of the first N-type transistor is coupled to the output terminal of the fourth inverter, the first source/drain of the first N-type transistor receives the second control signal of the selecting signal, and the second source/drain of the first N-type transistor is coupled to the output terminal of the phase selector.

According to an embodiment of the present invention, the second switch includes a second N-type transistor and a second P-type transistor. The gate of the second N-type transistor is coupled to the multiplexer for receiving the switch signal, the first source/drain of the second N-type transistor is coupled to the output terminal of the first inverter, and the second source/drain of the second N-type transistor is coupled to the output terminal of the phase selector. The gate of the second P-type transistor is coupled to the output terminal of the fourth inverter, the first source/drain of the second P-type transistor is coupled to the output terminal of the first inverter, and the second source/drain of the second P-type transistor is coupled to the output terminal of the phase selector.

According to an embodiment of the present invention, the first control signal includes a least significant bit (LSB) of the selecting signal.

According to an embodiment of the present invention, the second control signal is a most significant bit (MSB) of the selecting signal.

As described above, in the present invention, a first inverter and a selecting circuit are adopted for generating another half of a clock signal with inverted phase, and the selecting circuit is designed to allow a switch signal to have the same transmission route within the selecting circuit, so that both the size and the power consumption of the circuit are reduced and delay mismatch between inverted and non-inverted clock signals is avoided.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
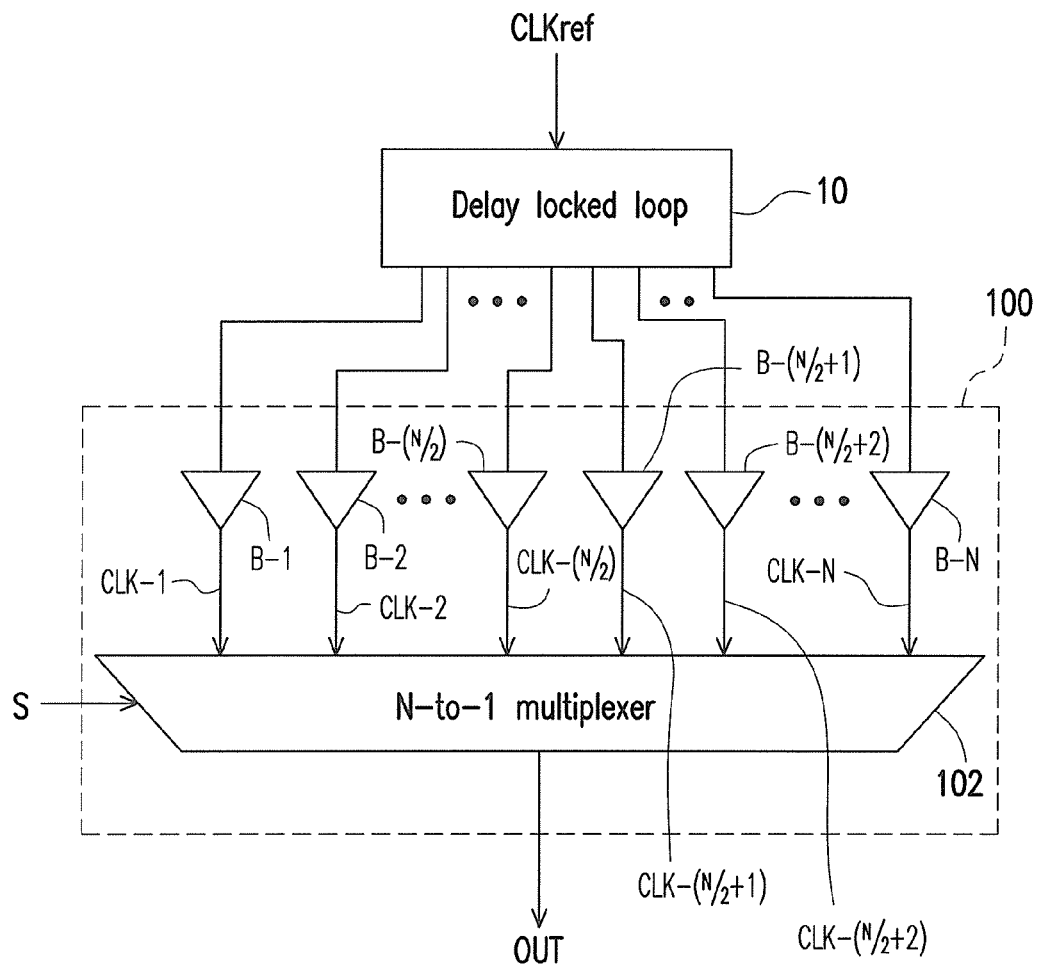
FIG. 1 is a block diagram of a conventional phase selector.

Reference will now be made in detail to the present preferred embodiments of the invention, examples of which are illustrated in the accompanying drawings. Wherever possible, the same reference numbers are used in the drawings and the description to refer to the same or like parts.

Figure 2:
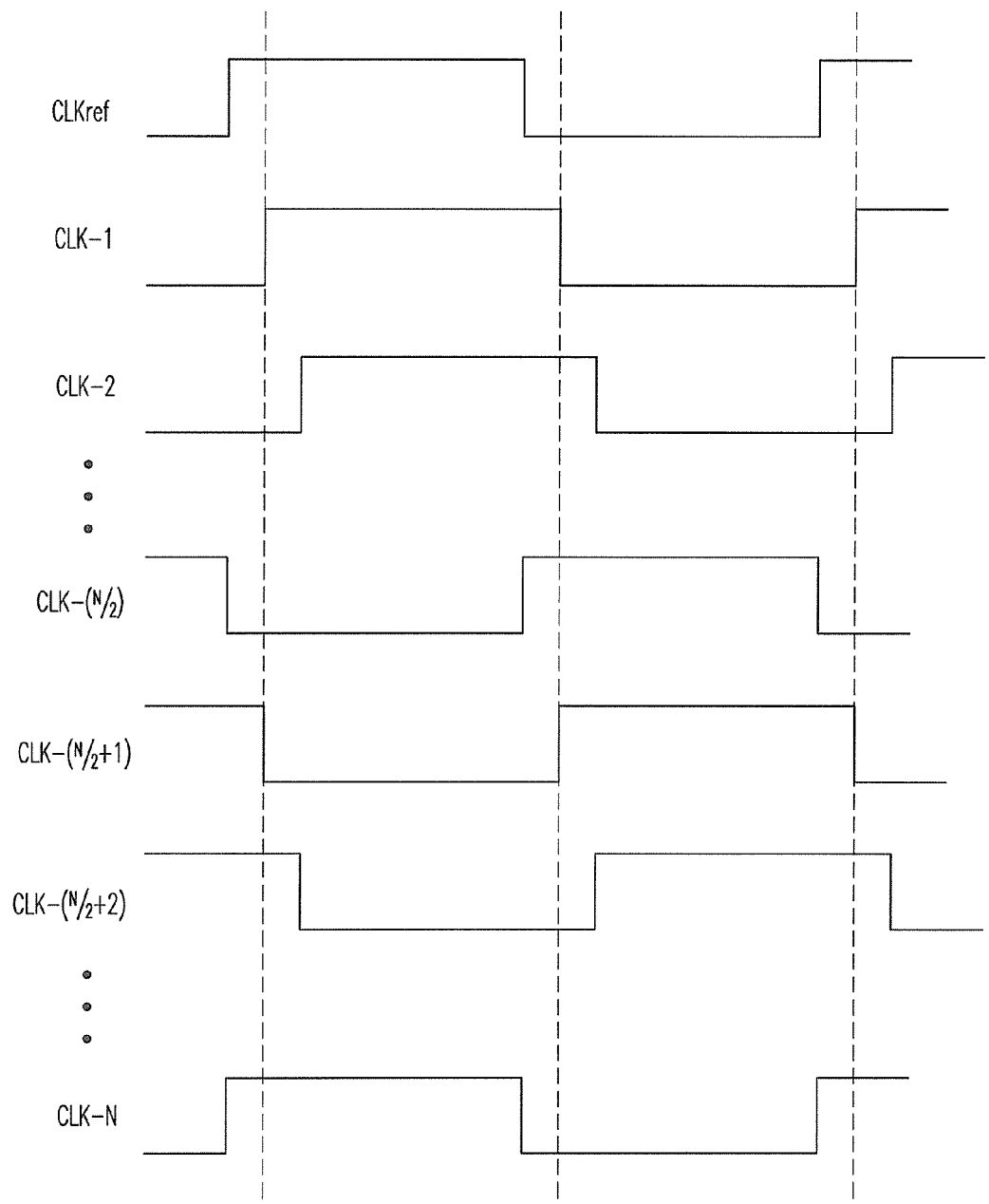
FIG. 2 illustrates the waveforms of a plurality of clock signals received by the phase selector in FIG. 1.

As shown in FIG. 2, half of the N clock signals output by the delay locked loop (DLL) 10 are inverted signals of the other half of the N clock signals. For example, the clock signal CLK-1 passing through the buffer B-1 and the clock signal CLK-(N/2+1) passing through the buffer B-(N/2+1) have reverse phases, the clock signal CLK-2 passing through the buffer B-2 and the clock signal CLK-(N/2+2) passing through the buffer B-(N/2+2) have reverse phases, . . . , and the clock signal CLK-(N/2) passing through the buffer B-(N/2) and the clock signal CLK-N passing through the buffer B-N have reverse phases. In following embodiments, the number of the buffers B-1-B-N and the number of input terminals of the multiplexer 102 are reduced (so as to reduce the size and the power consumption of the phase selector) based on foregoing feature of the DLL 10.

Figure 3:
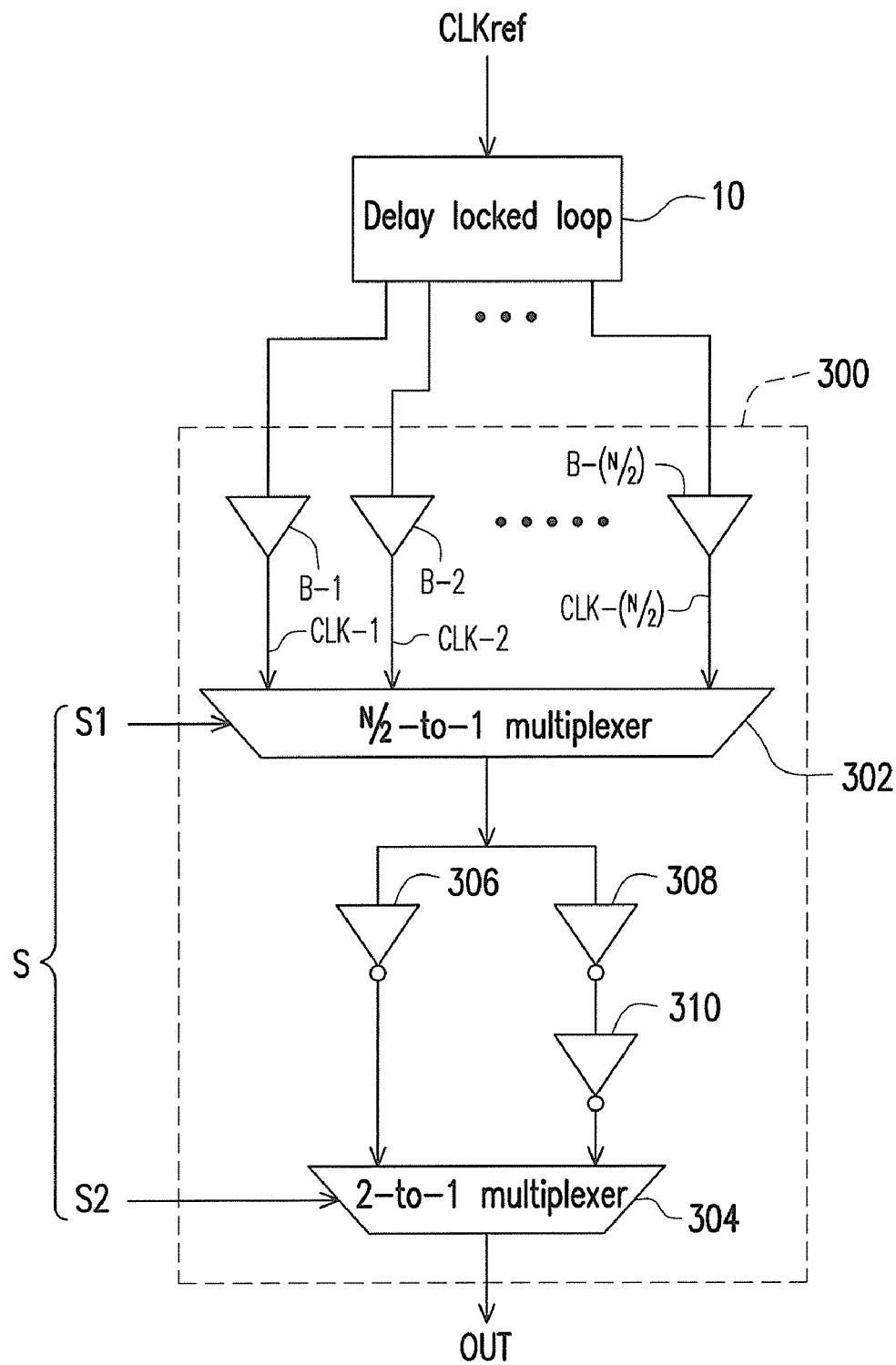
FIG. 3 is a block diagram of a phase selector according to an embodiment of the present invention.

FIG. 3 is a block diagram of a phase selector 300 according to an embodiment of the present invention. Referring to FIG. 3, the phase selector 300 includes N/2 buffers B-1-B-(N/2), an N/2-to-1 multiplexer 302, a 2-to-1 multiplexer 304, and three inverters 306, 308, and 310. The buffers B-1-B-(N/2) receives a plurality of clock signals CLK-1-CLK-(N/2) (as shown in FIG. 2) from the DLL 10. The multiplexer 302 outputs one of the N/2 clock signals CLK-1-CLK-(N/2) passing through the buffers B-1-B-(N/2) to the inverters 306 and 308 according to a first control signal S1. The first control signal 51 is first portion of bits of the selecting signal S. The inverter 306 inverts a clock signal output by the multiplexer 302 and inputs the inverted clock signal into the multiplexer 304. The inverter 308 and the inverter 310 are connected between the multiplexer 302 and the multiplexer 304 in series to form a buffer for buffering the clock signal output by the multiplexer 302. Thus, through the operation of the multiplexer 302, the inverter 310 outputs one of the clock signals CLK-1-CLK-(N/2), and the inverter 306 outputs one of the clock signals CLK-(N/2+1)-CLK-N. The multiplexer 304 selectively outputs the clock signal from the inverter 306 or the inverter 310 according to a second control signal S2. The second control signal S2 is second portion of bits of the selecting signal S. For example, the first control signal S1 includes a least significant bit (LSB) of the selecting signal S, and the second control signal S2 may be a most significant bit (MSB) of the selecting signal S. In this embodiment, the second control signal S2 is MSB of the selecting signal S, and the first control signal S1 is remainder bits of the selecting signal S except for the second control signal S2. Thus, the number of buffers and the size of the multiplexer (the N-to-1 multiplexer 102) in FIG. 1 can be greatly reduced by outputting clock signals with different phases through the operations of the inverters 306-310, the N/2-to-1 multiplexer 302, and the 2-to-1 multiplexer 304. Even though the phase selector 300 in the present embodiment has reduced buffer number and multiplexer size compared to the conventional phase selector 100, phase error (i.e., delay mismatch between two paths) exists between the clock signals because the number of inverters between two paths is different. This issue about phase error can be ignored in some low-frequency applications. However, the delay mismatch problem between an inverted phase (provided by the inverter 306) and a non-inverted phase (provided by the inverter 310) cannot be ignored in some high-frequency applications.

Figure 4:
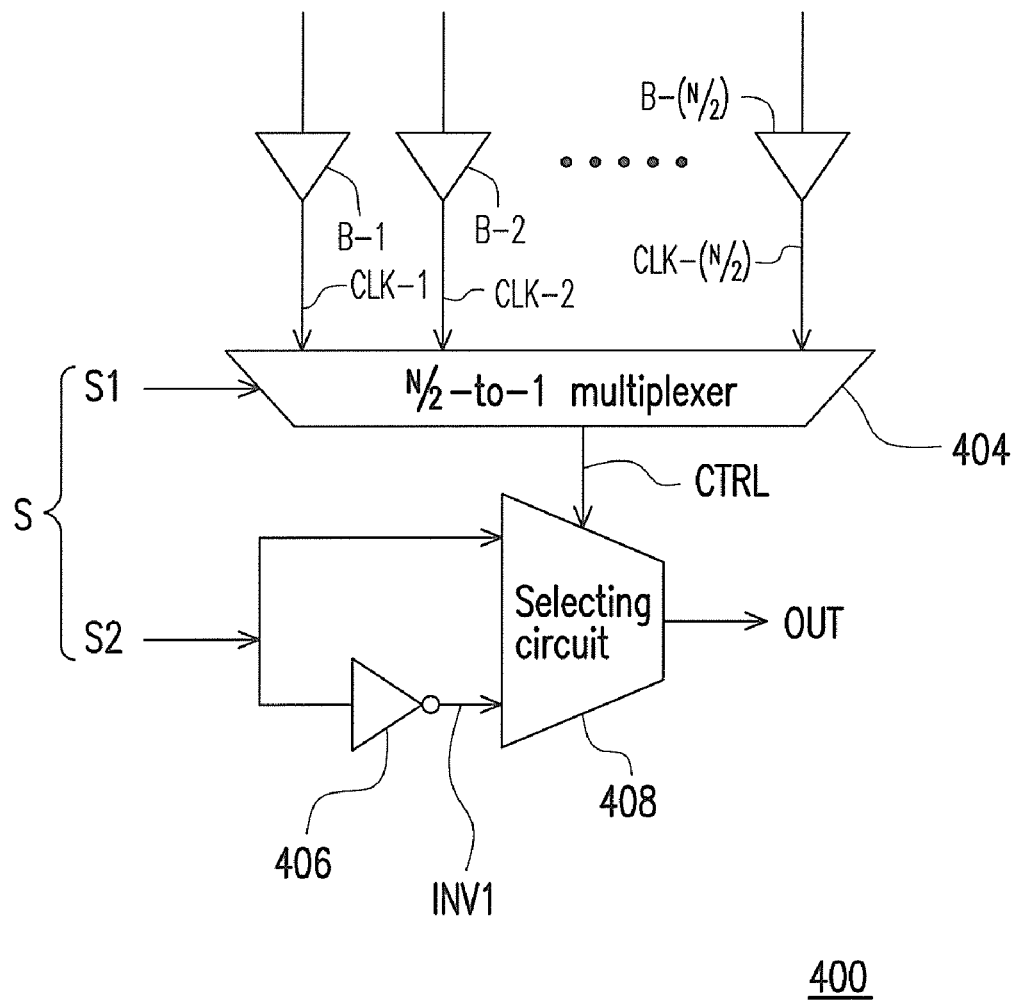
FIG. 4 is a block diagram of a phase selector according to another embodiment of the present invention.

FIG. 4 is a block diagram of a phase selector 400 according to another embodiment of the present invention. Referring to FIG. 4, the phase selector 400 includes a plurality of buffers B-1-B-(N/2), a multiplexer 404, an inverter 406, and a selecting circuit 408, wherein N is a positive integer. The buffers B-1-B-N/2 respectively receive a plurality of clock signals CLK-1-CLK-(N/2) (as shown in FIG. 2) from the DLL 10 and output the clock signals CLK-1-CLK-(N/2) to the multiplexer 404. The multiplexer 404 selects one of the clock signals CLK-1-CLK-(N/2) received from the buffers B-1-B-(N/2) as a switch signal CTRL according to the first control signal S1 in the selecting signal S, wherein the switch signal CTRL controls the selecting circuit 408.

In addition, the input terminal of the inverter 406 receives and inverts the second control signal S2 of the selecting signal S, and the output terminal thereof outputs an inverted signal INV1. The selecting circuit 408 selectively outputs the second control signal S2 of the selecting signal S or the inverted signal INV1 according to the switch signal CTRL. For example, when the switch signal CTRL is in a first logic state, the selecting circuit 408 transmits the second control signal S2 of the selecting signal S to the output terminal OUT of the phase selector 400, and when the switch signal CTRL is in a second logic state, the selecting circuit 408 transmits the inverted signal INV1 to the output terminal OUT of the phase selector 400.

Figure 5:
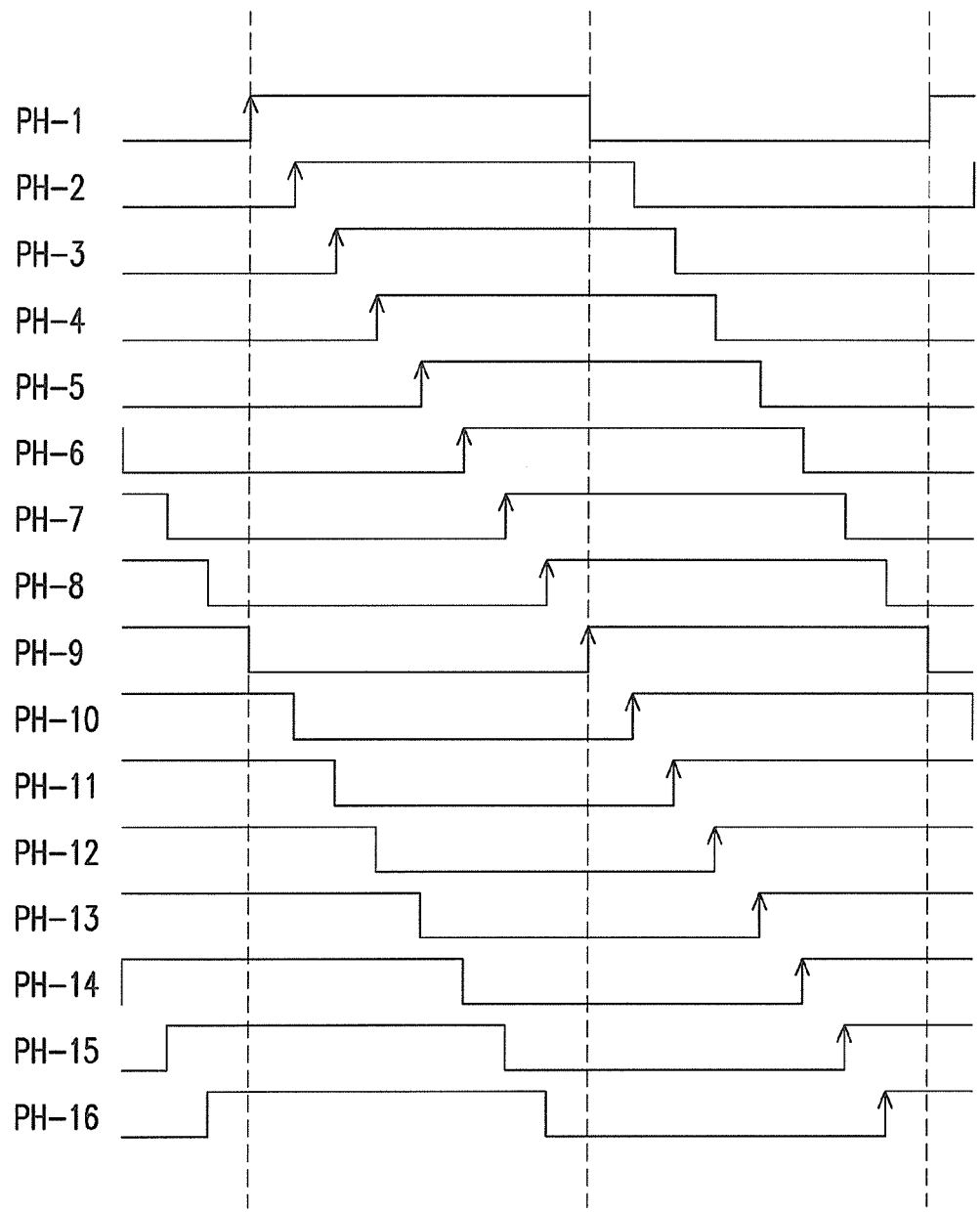
FIG. 5 illustrates the waveforms of clock signals output by a phase selector according to an embodiment of the present invention.

For example, if N is 16, the clock signals output by the phase selector 400 are as shown in FIG. 5, wherein the phases PH-1-PH-8 are reverse to the phases PH-9-PH-16. If the second control signal S2 of the selecting signal S is at a low voltage level and the first control signal S1 thereof has a value 0, the multiplexer 404 selects the clock signal CLK-1 as the switch signal CTRL according to the first control signal S1 of the selecting signal S, and the inverted signal INV1 is at a high voltage level. When the clock signal CLK-1 is at the low voltage level, the selecting circuit 408 transmits the second control signal S2 (currently at the low voltage level) of the selecting signal S to the output terminal OUT of the phase selector 400. When the clock signal CLK-1 is at the high voltage level, the selecting circuit 408 transmits the inverted signal INV1 (currently at the high voltage level) to the output terminal OUT of the phase selector 400. Thus, the output terminal OUT of the phase selector 400 can provide the phase PH-1, as shown in FIG. 5. Even though the phase selector 400 does not transmit the clock signal CLK-1 to the output terminal OUT, the phase PH-1 is equivalent to the clock signal CLK-1.

Contrarily, if the second control signal S2 of the selecting signal S is at the high voltage level, the inverted signal INV1 is at the low voltage level. Herein it is still assumed that the multiplexer 404 selects the clock signal CLK-1 as the switch signal CTRL. When the clock signal CLK-1 is at the low voltage level, the selecting circuit 408 transmits the second control signal S2 (currently at the high voltage level) of the selecting signal S to the output terminal OUT of the phase selector 400. When the clock signal CLK-1 is at the high voltage level, the selecting circuit 408 transmits the inverted signal INV1 (currently at the low voltage level) to the output terminal OUT of the phase selector 400. Thus, the output terminal OUT of the phase selector 400 can provide the phase PH-9 reverse to the phase PH-1, as shown in FIG. 5. Similarly, the output terminal OUT of the phase selector 400 can provide the phase PH-16 reverse to the phase PH-8. The phase selector 400 does not provide the clock signal CLK-9 through the DLL 10 but provide the phase PH-9 equivalent to the clock signal CLK-9.

As described above, the clock signal PH-1 or PH-9 is selectively output by inverting the second control signal S2 of the selecting signal S through the inverter 406 and outputting the second control signal S2 of the selecting signal S or the inverted signal INV1 through the selecting circuit 408. Similarly, other phases may be output through the technique described above, and the detailed operations will not be described herein. Compared to the conventional phase selector that requires 16 buffers and a 16-to-1 multiplexer to output all the phases, the phase selector 400 in the present embodiment requires only 8 buffers B-1-B-8 and an 8-to-1 multiplexer 404 to output the same phases. Thus, the phase selector 400 in the present embodiment has reduced number of buffers, reduced size of the multiplexer 404, and reduced power consumption.

Figure 6:
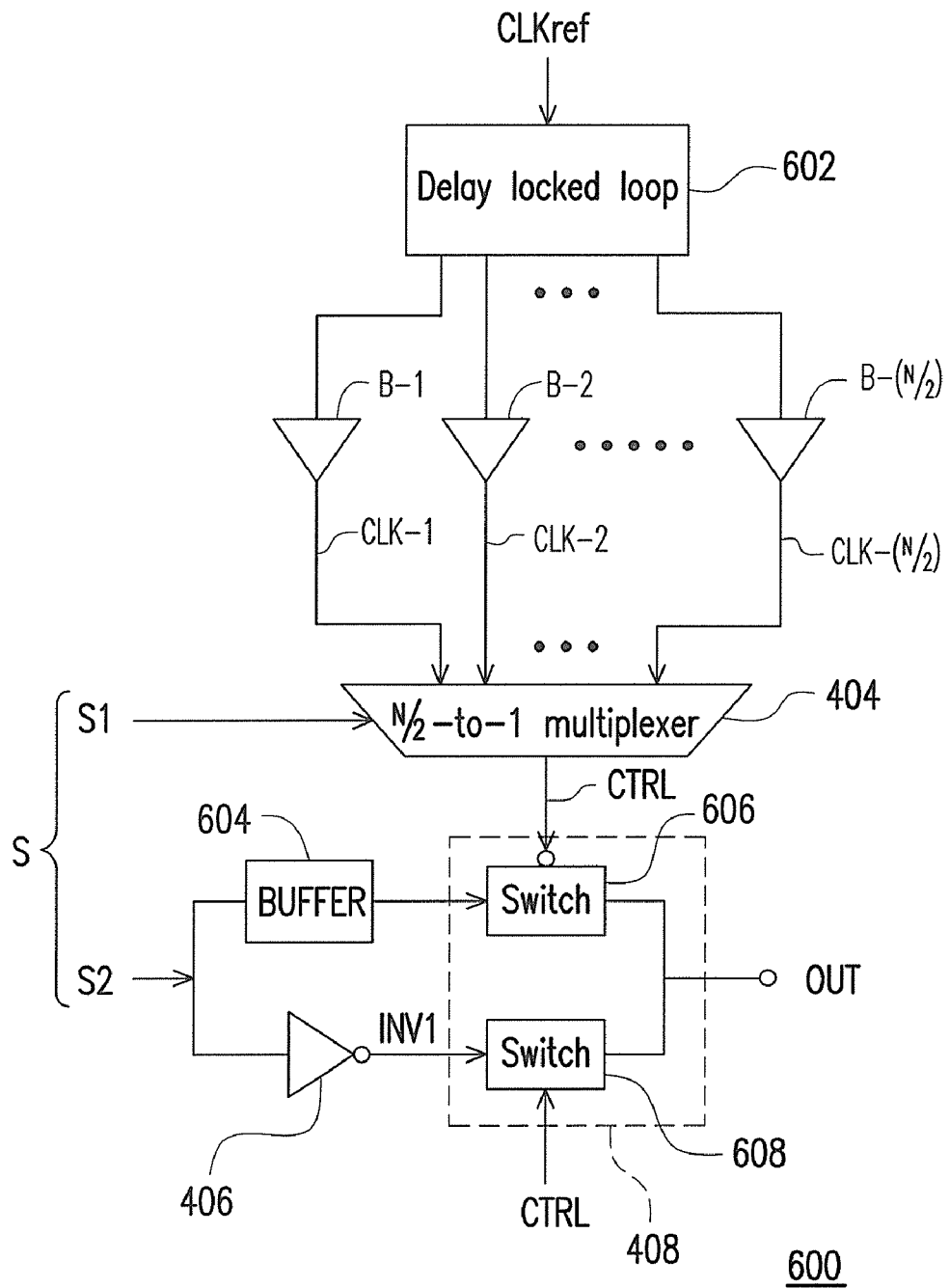
FIG. 6 is a block diagram of a phase selector according to another embodiment of the present invention.

To be specific, the phase selector 400 in FIG. 4 may further include a buffer for buffering the second control signal S2 of the selecting signal S. FIG. 6 is a block diagram of a phase selector 600 according to another embodiment of the present invention. Some parts of the embodiment illustrated in FIG. 6 can be referred to related descriptions of FIG. 4. Referring to FIG. 6, the phase selector 600 can be applied to a plurality of clock signals CLK-1-CLK-(N/2) output by the DLL 602 or a phase locked loop (PLL). The buffers B-1-B-(N/2) are coupled to the selecting circuit 408. The buffer 604 buffers the second control signal S2 of the selecting signal S. The selecting circuit 408 includes a switch 606 and a switch 608. The first end of the switch 606 receives the second control signal S2 of the selecting signal S, and the second end thereof is coupled to the output terminal OUT of the phase selector 600. The switch 606 is turned on when the switch signal CTRL is at a first logic state. The first end of the switch 608 receives the inverted signal INV1, and the second end thereof is coupled to the output terminal OUT of the phase selector 600. The switch 608 is turned on when the switch signal CTRL is at a second logic state.

Figure 7:
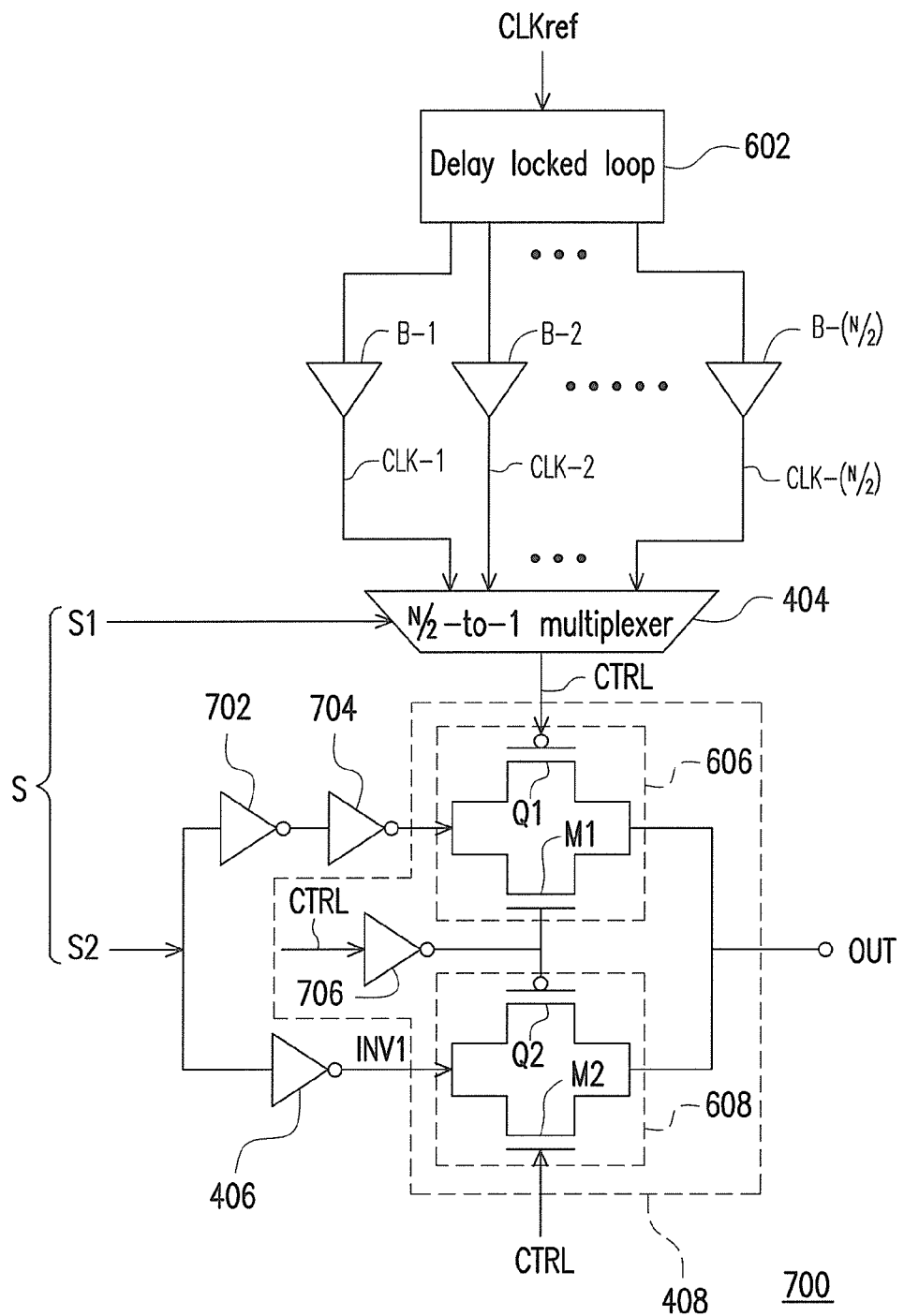
FIG. 7 is a block diagram of a phase selector according to yet another embodiment of the present invention.

The buffer 604, the switch 606, and the switch 608 can be implemented through any technique. For example, the switches 606 and 608 may be implemented as illustrated in FIG. 7. FIG. 7 is a block diagram of a phase selector 700 according to yet another embodiment of the present invention. Referring to FIG. 7, in the present embodiment, the buffer 604 is composed of inverters 702 and 704. The input terminal of the inverter 702 receives the second control signal S2 of the selecting signal S, the input terminal of the inverter 704 is coupled to the output terminal of the inverter 702, and the output terminal of the inverter 704 is coupled to the first end of the switch 606.

The switch 606 includes a P-type transistor Q1 and an N-type transistor M1. The switch 608 includes a P-type transistor Q2 and an N-type transistor M2. The gates of the transistors Q1 and M2 are coupled to the multiplexer 404 for receiving the switch signal CTRL. The first sources/drains of the transistors Q1 and M1 receive the second control signal S2 of the selecting signal S, and the second sources/drains of the transistors Q1 and M1 are coupled to the output terminal OUT of the phase selector 700. The gates of the transistors M1 and Q2 are coupled to the output terminal of the inverter 706 for receiving the inverted signal of the switch signal CTRL. The input terminal of the inverter 706 is coupled to the multiplexer 404 for receiving the switch signal CTRL. On the other hand, the first sources/drains of the transistors M2 and Q2 receive the inverted signal INV1, and the second sources/drains of the transistors M2 and Q2 are coupled to the output terminal OUT of the phase selector 700.

As described above, the buffers B-1-B-(N/2) buffer the clock signals CLK-1-CLK-(N/2) output by the DLL 602 and provide the clock signals CLK-1-CLK-(N/2) to the multiplexer 404. The multiplexer 404 selects one of the clock signals CLK-1-CLK-(N/2) as the switch signal CTRL according to the first control signal S1 in the selecting signal S. Herein it is assumed that N has a value 16 and the phases output by the phase selector 700 are as illustrated in FIG. 5. If the second control signal S2 of the selecting signal S is at a low voltage level, the multiplexer 404 outputs the clock signal CLK-1 (i.e., the switch signal CTRL) according to the first control signal S1 in the selecting signal S. When the switch signal CTRL is at a high voltage level, the transistors Q1 and M1 are turned off, and the transistors Q2 and M2 are turned on. Thus, the inverted signal INV1 (currently at the high voltage level) is transmitted to the output terminal OUT of the phase selector 700 through the transistors Q2 and M2. When the switch signal CTRL is at the low voltage level, the transistors Q1 and M1 are turned on, and the transistors Q2 and M2 are turned off. Thus, the second control signal S2 (currently at the low voltage level) of the selecting signal S is transmitted to the output terminal OUT of the phase selector 700 through the transistors Q1 and M1. Thereby, the phase selector 700 can output the phase PH-1 equivalent to the clock signal CLK-1.

Contrarily, if the second control signal S2 of the selecting signal S is at the high voltage level and the multiplexer 404 still selects the clock signal CLK-1 as the switch signal CTRL, when the switch signal CTRL is at the high voltage level, the transistors Q1 and M1 are turned off, and the transistors Q2 and M2 are turned on. Thus, the inverted signal INV1 (currently at the low voltage level) is transmitted to the output terminal OUT of the phase selector 700 through the transistors Q2 and M2. When the switch signal CTRL is at the low voltage level, the transistors Q1 and M1 are turned on, and the transistors Q2 and M2 are turned off. Thus, the second control signal S2 (currently at the high voltage level) of the selecting signal S is transmitted to the output terminal OUT of the phase selector 700 through the transistors Q1 and M1. Thereby, the phase selector 700 can output the phase PH-9 equivalent to the inverted signal of the clock signal CLK-1. Similarly, the phase selector 700 can output the phase PH-16 equivalent to the inverted signal of the clock signal CLK-8.

Thereby, by adopting the design of the selecting circuit 408 illustrated in FIG. 7, not only the size and the power consumption of the circuit are reduced, but the switch signal CTRL is made to have the same transmission route in the selecting circuit 408 so that delay mismatch between inverted and non-inverted clock signals output by the output terminal OUT of the phase selector 700 is avoided.

As described above, in the present invention, an inverter and a selecting circuit are adopted to generate a clock signal with an inverted phase, and selecting circuit is designed so that a switch signal has the same transmission route therein. Thus, the number of buffers adopted, the circuit area of the multiplexer, and the power consumption of the selecting circuit are all reduced, and the problem of delay mismatch between inverted and non-inverted clock signals output by a phase selector is avoided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A phase selector, comprising:
    a plurality of first buffers, wherein each of the first buffers provides a clock signal, and the clock signals have different phases;
    a multiplexer, coupled to the first buffers, for selectively outputting one of the clock signals as a switch signal according to a first control signal, wherein the first control signal is first portion of bits of a selecting signal, and the first control signal includes a least significant bit (LSB) of the selecting signal;
    a first inverter, having an input terminal for receiving a second control signal, wherein the second control signal is second portion of bits of the selecting signal and an output terminal for outputting an inverted signal, and the second control signal is a most significant bit (MSB) of the selecting signal; and
    a selecting circuit, controlled by the switch signal, for transmitting the second control signal of the selecting signal to an output terminal of the phase selector when the switch signal is in a first logic state and transmitting the inverted signal to the output terminal of the phase selector when the switch signal is in a second logic state.

2. The phase selector according to claim 1 further comprising:
    a second buffer, coupled to the selecting circuit for buffering the second control signal of the selecting signal.

3. The phase selector according to claim 2, wherein the second buffer comprises:
    a second inverter, having an input terminal for receiving the second control signal of the selecting signal; and
    a third inverter, having an input terminal connected to an output terminal of the second inverter and an output terminal connected to the selecting circuit.

4. The phase selector according to claim 1, wherein the selecting circuit comprises:
    a first switch, having a first end for receiving the second control signal of the selecting signal and a second end coupled to the output terminal of the phase selector, wherein the first switch is turned on when the switch signal is in the first logic state; and
    a second switch, having a first end for receiving the inverted signal and a second end coupled to the output terminal of the phase selector, wherein the second switch is turned on when the switch signal is in the second logic state.

5. The phase selector according to claim 4 further comprising:
    a fourth inverter, having an input terminal coupled to the multiplexer for inverting the switch signal.

6. The phase selector according to claim 5, wherein the first switch comprises:
    a first P-type transistor, having a gate coupled to the multiplexer for receiving the switch signal, a first source/drain for receiving the second control signal of the selecting signal, and a second source/drain coupled to the output terminal of the phase selector; and
    a first N-type transistor, having a gate coupled to an output terminal of the fourth inverter, a first source/drain for receiving the second control signal of the selecting signal, and a second source/drain coupled to the output terminal of the phase selector.

7. The phase selector according to claim 5, wherein the second switch comprises:
    a second N-type transistor, having a gate coupled to the multiplexer for receiving the switch signal, a first source/drain coupled to the output terminal of the first inverter, and a second source/drain coupled to the output terminal of the phase selector; and
    a second P-type transistor, having a gate coupled to the output terminal of the fourth inverter, a first source/drain coupled to the output terminal of the first inverter, and a second source/drain coupled to the output terminal of the phase selector.

* * * * *